United States Patent
Kobayashi

(10) Patent No.: US 10,263,588 B2
(45) Date of Patent: Apr. 16, 2019

(54) METHOD OF MANUFACTURING PIEZOELECTRIC VIBRATOR ELEMENT, PIEZOELECTRIC VIBRATOR ELEMENT, AND PIEZOELECTRIC VIBRATOR

(71) Applicant: SII Crystal Technology Inc., Chiba-shi, Chiba (JP)

(72) Inventor: Takashi Kobayashi, Chiba (JP)

(73) Assignee: SII CRYSTAL TECHNOLOGY INC., Chiba (JP)

(*) Notice: Subject to any disclaimer, the term of this patent is extended or adjusted under 35 U.S.C. 154(b) by 431 days.

(21) Appl. No.: 15/156,905

(22) Filed: May 17, 2016

(65) Prior Publication Data

US 2016/0344362 A1 Nov. 24, 2016

(30) Foreign Application Priority Data

May 22, 2015 (JP) .................. 2015-104990

(51) Int. Cl.
| | |
|---|---|
| *H01L 41/22* | (2013.01) |
| *H03H 9/02* | (2006.01) |
| *H03H 9/205* | (2006.01) |
| *H03H 3/04* | (2006.01) |
| *H03H 9/21* | (2006.01) |

(52) U.S. Cl.
CPC ............. *H03H 3/04* (2013.01); *H03H 9/21* (2013.01); *H03H 2003/0428* (2013.01)

(58) Field of Classification Search
CPC .................................. H03H 3/04; H03H 9/21
USPC ........... 310/312; 216/41, 58, 75; 250/492.3; 204/192.3, 193.34, 192.33
See application file for complete search history.

(56) References Cited

U.S. PATENT DOCUMENTS

| | | | | |
|---|---|---|---|---|
| 5,662,782 A * | 9/1997 | Gomi | ....................... | H03H 3/04 156/345.24 |
| 2002/0100744 A1* | 8/2002 | Leitz | ....................... | H03H 3/04 216/66 |
| 2004/0212459 A1* | 10/2004 | Aigner | .................... | C23C 14/58 333/197 |
| 2008/0129415 A1* | 6/2008 | Iwai | ....................... | H03H 9/215 333/188 |
| 2010/0231088 A1* | 9/2010 | Kobayashi | .............. | B24B 37/08 310/311 |
| 2011/0291524 A1* | 12/2011 | Kawase | ............... | H03H 9/0595 310/312 |
| 2011/0298555 A1* | 12/2011 | Kawai | ...................... | H03H 3/04 331/158 |

(Continued)

FOREIGN PATENT DOCUMENTS

JP 2013-118652 A 6/2013

*Primary Examiner* — Thomas M Dougherty
(74) *Attorney, Agent, or Firm* — Brinks Gilson & Lione

(57) ABSTRACT

A method of manufacturing a piezoelectric vibrator element, a piezoelectric vibrator element, and a piezoelectric vibrator, superior in vibration characteristics, high in quality, and capable of suppressing a variation in frequency after a frequency adjustment, are provided. The method includes a first frequency adjustment step of performing ion milling on a weight metal film for a frequency adjustment formed on a surface of a tip part in each of a pair of vibrating arm parts, and a second frequency adjustment step of performing ion milling on the weight metal film at a lower etch rate than in the first frequency adjustment step after the first frequency adjustment step.

7 Claims, 5 Drawing Sheets

(56) References Cited

U.S. PATENT DOCUMENTS

| | | | |
|---|---|---|---|
| 2012/0248938 A1* | 10/2012 | Kawanishi | H03H 9/0595 |
| | | | 310/344 |
| 2013/0020915 A1* | 1/2013 | Sakamoto | H03H 3/02 |
| | | | 310/370 |
| 2015/0188514 A1* | 7/2015 | Yamada | G01L 1/106 |
| | | | 331/156 |
| 2016/0308510 A1* | 10/2016 | Ishino | H03H 9/215 |
| 2017/0093336 A1* | 3/2017 | Kawashima | H03H 3/02 |

* cited by examiner

METHOD OF MANUFACTURING PIEZOELECTRIC VIBRATOR ELEMENT, PIEZOELECTRIC VIBRATOR ELEMENT, AND PIEZOELECTRIC VIBRATOR

RELATED APPLICATIONS

This application claims priority under 35 U.S.C. § 119 to Japanese Patent Application No. 2015-104990 filed on May 22, 2015, the entire content of which is hereby incorporated by reference.

BACKGROUND OF THE INVENTION

1. Field of the Invention

The present invention relates to a method of manufacturing a piezoelectric vibrator element, a piezoelectric vibrator element, and a piezoelectric vibrator.

2. Background Art

For example, in the electronic apparatus such as a cellular phone or a portable information terminal, there is used a piezoelectric vibrator using a quartz crystal or the like as a device used for a time source, a timing source for a control signal and so on, a reference signal source, and so on. As a piezoelectric vibrator of this kind, there has been known a device having a piezoelectric vibrator element hermetically encapsulated in a package provided with a cavity.

The piezoelectric vibrator element described above is provided with a base, and a pair of vibrating arm parts extending from the base in parallel to each other. In the piezoelectric vibrator element, the vibrating arm parts vibrate at a predetermined resonant frequency in directions of getting closer to and away from each other using base end parts (connection parts with the base) as the respective supporting points.

Here, as a method of adjusting the frequency of the piezoelectric vibrator element (the vibrating arm parts), there is a method of previously forming a weight metal film in a tip part of each of the vibrating arm parts, and adjusting the mass of the vibrating arm parts by partially removing (trimming) the weight metal films to thereby adjusting the frequency of the vibrating arm parts to a target value. For example, in JP-A-2013-118652 (Patent Document 1), there is disclosed a configuration in which the weight metal film is irradiated with a laser beam to partially eliminating the weight metal film to perform a coarse adjustment of the resonant frequency, and then the weight metal film is irradiated with an ion beam to perform a fine adjustment of the resonant frequency.

However, if the trimming is performed using a laser beam as in Patent Document 1 described above, there is a possibility that a burr is formed in a recessed part of the weight metal film formed by the trimming, or particles of the weight metal film scattered by the trimming adhere again to the surfaces of the vibrating arm parts. Further, if the burr or the particle is separated after the fine adjustment, there arises a problem that the frequency adjusted by the trimming varies.

Further, recently, due to miniaturization of electronic devices and so on, miniaturization of the piezoelectric vibrator and the piezoelectric vibrator element mounted on the electronic devices is requested. However, if the length of the vibrating arm part is shortened for miniaturizing the piezoelectric vibrator element, the variation in frequency increases. In contrast, if the thickness of the weight metal film is increased in order to reduce the variation in frequency, the trimming by the laser beam becomes difficult.

SUMMARY OF THE INVENTION

The present invention has been made in consideration of the circumstances described above, and has an object of providing a method of manufacturing a piezoelectric vibrator element, a piezoelectric vibrator element, and a piezoelectric vibrator, which are high in quality, superior in vibration characteristics, and capable of suppressing the variation in frequency after the frequency adjustment.

In order solve the problems described above, the invention provides the following configurations.

A method of manufacturing a piezoelectric vibrator element according to an aspect of the invention includes a first frequency adjustment step of performing ion milling on a weight metal film for a frequency adjustment formed on a surface of a tip part in each of a pair of vibrating arm parts, and a second frequency adjustment step of performing ion milling on the weight metal film at a lower etch rate than in the first frequency adjustment step after the first frequency adjustment step.

Further, a piezoelectric vibrator element according to another aspect of the invention is the piezoelectric vibrator element manufactured using the method of manufacturing a piezoelectric vibrator element according to the aspect of the invention including a recessed part formed by partially removing the weight metal film using the ion milling.

According to these configurations, by performing the frequency adjustment steps using ion milling, occurrence of the burr after the trimming can be suppressed unlike the case of performing the trimming using the laser as in the related art. Further, by trimming the weight metal film using ion milling, the particles of the weight metal film scattered from the area (a trimming area) out of the weight metal film can be made smaller in size compared to the case of performing the trimming using the laser. Therefore, even if the particles of the weight metal film adhere again on the piezoelectric vibrator element, it is possible to inhibit the particles having adhered again from being separated from the piezoelectric vibrator element.

Therefore, it is possible to provide the piezoelectric vibrator element, which is superior in vibration characteristics, high in quality, and capable of suppressing a variation in the resonant frequency of the vibrating arm parts after the frequency adjustment.

Moreover, by performing each of the frequency adjustment steps using ion milling, the weight metal film can be trimmed irrespective of the thickness of the weight metal film, and therefore, it is possible to deal with thickening of the weight metal film due to miniaturization of the piezoelectric vibrator element.

Further, since the etch rate in the second frequency adjustment step is set to be lower than in the first frequency adjustment step, the frequency of the vibrating arm parts can finely be adjusted so as to come closer to the target frequency. Thus, a further improvement in quality can be achieved.

In the method of manufacturing a piezoelectric vibrator element according to the aspect of the invention, it is possible that the first frequency adjustment step is performed prior to mounting on a package.

According to this configuration, by performing the first frequency adjustment step before the mounting on the package, the trimming of the weight metal film can be performed in the state in which the piezoelectric vibrator element (the wafer) is held by a jig in the stable posture. Thus, the desired area out of the weight metal film can surely be trimmed.

In the method of manufacturing a piezoelectric vibrator element according to the aspect of the invention, it is possible that the second frequency adjustment step is performed after the mounting on the package.

According to this configuration, by performing the second frequency adjustment step after the mounting on the package, the frequency of the vibrating arm parts can be adjusted in the state more similar to the real product (the piezoelectric vibrator). Thus, a further improvement in quality can be achieved.

In the method of manufacturing a piezoelectric vibrator element according to the aspect of the invention, it is possible that the first frequency adjustment step and the second frequency adjustment step each include a mask setting step of setting a mask having an opening part on the vibrating arm parts, and a trimming step of trimming a part exposed through the opening part out of the weight metal film using ion milling, and in the mask setting step, the mask is set so that a base end part of the weight metal film is covered.

According to this configuration, by covering the base end part of the weight metal film with the mask in each of the frequency adjustment steps, it is possible to inhibit the excitation electrode and so on formed on the base end side of the weight metal film in the vibrating arm parts from being trimmed together with the weight metal film. Thus, it is possible to inhibit breaking of the excitation electrodes and so on to increase the yield ratio.

In the method of manufacturing a piezoelectric vibrator element according to the aspect of the invention, it is possible that in the first frequency adjustment step and the second frequency adjustment step of, the ion milling is performed with a depth with which the weight metal film is not penetrated.

According to this configuration, by performing the trimming with the depth with which the weight metal film is not penetrated in each of the frequency adjustment steps, it becomes possible to provide tolerance in the amount of the trimming (depth) in each of the frequency adjustment steps. Therefore, it becomes easy to absorb the variation in frequency in each of the piezoelectric vibrator elements by the adjustment of the amount of the trimming.

A piezoelectric vibrator according to another aspect of the invention includes the piezoelectric vibrator element according to the aspect of the invention described above, and a package adapted to hermetically encapsulate the piezoelectric vibrator element.

According to this configuration, since the piezoelectric vibrator element according to the aspect of the invention described above is hermetically encapsulated in the package, the piezoelectric vibrator superior in vibration characteristics and high in quality can be provided.

According to the invention, it is possible to provide the piezoelectric vibrator element and the piezoelectric vibrator, which are superior in vibration characteristics, high in quality, and capable of suppressing a variation in the frequency after the frequency adjustment.

DETAILED DESCRIPTION OF THE PREFERRED EMBODIMENT

An embodiment according to the invention will hereinafter be described with reference to the accompanying drawings.

<Piezoelectric Vibrator>

Figure 1:
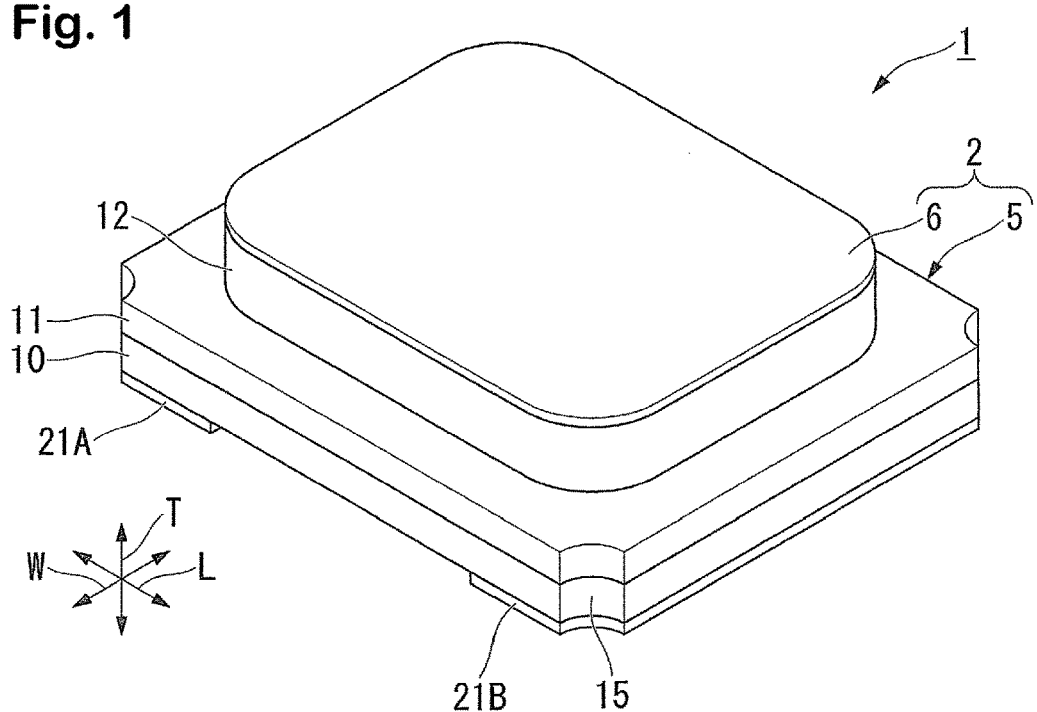
FIG. 1 is an external perspective view of a piezoelectric vibrator according to an embodiment of the invention.
Figure 2:
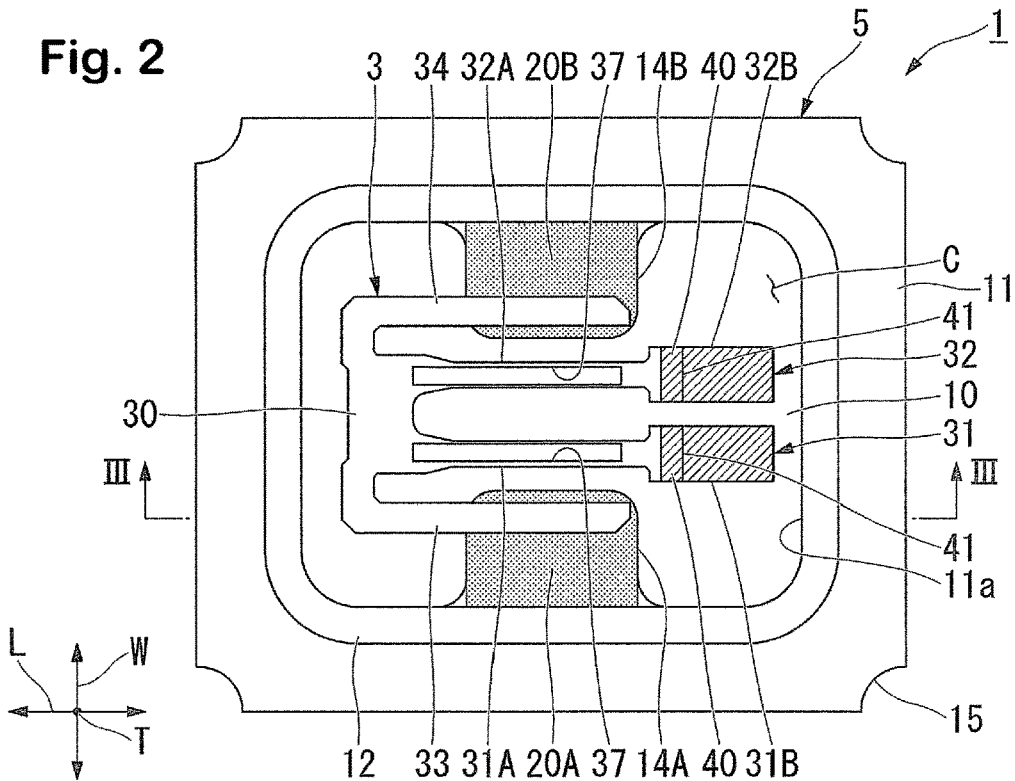
FIG. 2 is a plan view of the piezoelectric vibrator, showing a state with a sealing plate detached.
Figure 3:
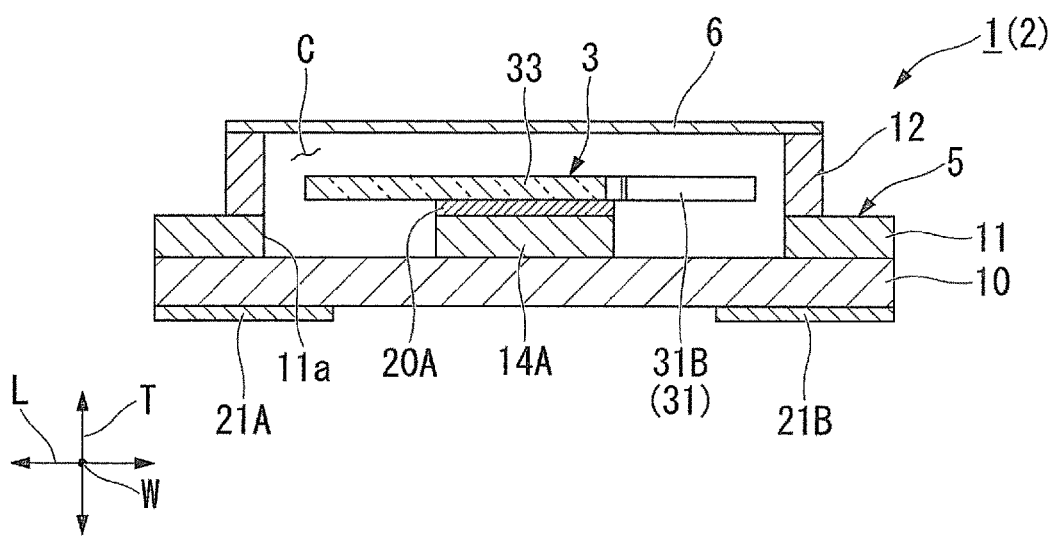
FIG. 3 is a cross-sectional view along the line III-III shown in FIG. 2.
Figure 4:
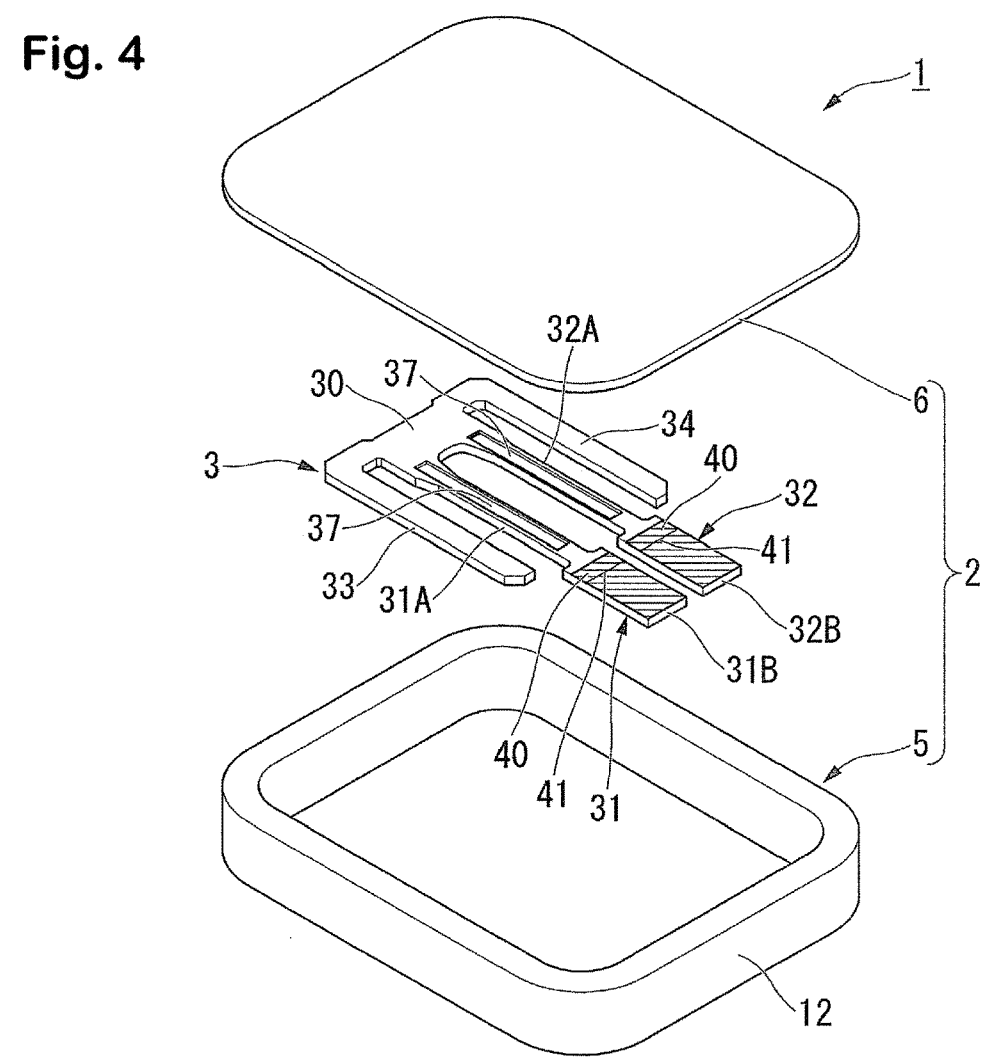
FIG. 4 is an exploded perspective view of the piezoelectric vibrator according to the embodiment of the invention.

FIG. 1 is an external perspective view of a piezoelectric vibrator 1 according to the embodiment of the invention. FIG. 2 is a plan view of the piezoelectric vibrator 1, showing a state with a sealing plate 6 detached. FIG. 3 is a cross-sectional view along the line III-III shown in FIG. 2. FIG. 4 is an exploded perspective view of the piezoelectric vibrator 1 according to the embodiment.

As shown in FIG. 1 through FIG. 4, the piezoelectric vibrator 1 is a so-called ceramic package-type surface-mounted vibrator, and is provided with a package 2 incorporating a cavity C hermetically sealed, and a piezoelectric vibrator element 3 housed in the cavity C. It should be noted that the piezoelectric vibrator 1 exhibits a rectangular solid shape. Therefore, in the present embodiment, the longitudinal direction of the piezoelectric vibrator 1 is referred to as a longitudinal direction L, the short-side direction is referred to as a width direction W, and the direction perpendicular to both of the longitudinal direction L and the width direction W is referred to as a thickness direction T in a planar view.

The package 2 is provided with a package main body 5, and a sealing plate 6, which is bonded to the package main body 5 to form the cavity C between the sealing plate 6 and the package main body 5.

The package main body 5 is provided with a first base substrate 10 and a second base substrate 11 bonded to each other in an overlapping state, and a sealing ring 12 bonded on the second base substrate 11.

As the first base substrate 10, there is used a substrate made of ceramics, and exhibiting a rectangular shape in a planar view viewed from the thickness direction T, and the upper surface of the first base substrate 10 constitutes a bottom part of the cavity C. On the lower surface of the first base substrate 10, there are formed a pair of external electrodes 21A, 21B in the longitudinal direction L with a space. The external electrodes 21A, 21B are each formed of a single layer film made of single metal or a laminated film having different metals stacked one another formed by vapor deposition or sputtering, for example.

The second base substrate 11 is a substrate made of ceramics having an outline in a planar view exhibiting the same shape as that of the first base substrate 10, and is integrally bonded in a state of overlapping the surface of the first base substrate 10 by sintering or the like. It should be noted that as the ceramic material used for each of the base substrates 10, 11, there can be used, for example, HTCC (High Temperature Co-Fired Ceramic) made of alumina, LTCC (Low Temperature Co-Fired Ceramic) made of glass ceramics, and so on.

As shown in FIG. 2 through FIG. 4, the second base substrate 11 is provided with a penetrating part 11a penetrating the second base substrate 11 in the thickness direction T. The penetrating part 11a exhibits a rectangular shape in a planar view, and has four corners rounded. In the inner surface of the penetrating part 11a, in the parts located on both sides in the width direction W, there are formed mounting parts 14A, 14B protruding inward in the width direction W, respectively. It should be noted that the mounting parts 14A, 14B are located in a central part in the longitudinal direction L in the second base substrate 11.

On the mounting parts 14A, 14B, there are formed a pair of electrode pads 20A, 20B, respectively, which are connection electrodes with the piezoelectric vibrator element 3. Similarly to the external electrodes 21A, 21B described above, the electrode pads 20A, 20B are each formed of a single layer film made of single metal or a laminated film having different metals stacked one another formed by vapor deposition or sputtering, for example. The electrode pads 20A, 20B and the external electrodes 21A, 21B are electrically connected to each other, respectively, via respective through interconnections not shown penetrating the base substrates 10, 11 in the thickness direction T.

On the four corners of each of the base substrates 10, 11, there are formed cutout parts 15 each having a quarter-arc shape in a planar view throughout the entire substrate in the thickness direction T of the both base substrates 10, 11. The base substrates 10, 11 are manufactured by bonding two ceramic substrates in, for example, a wafer state so as to overlap each other, then forming a plurality of through holes penetrating both of the ceramic substrates and arranged in a matrix, and then cutting both of the ceramic substrates in a grid manner with reference to the through holes. On this occasion, since each of the through holes is divided into four parts, the cutout parts 15 described above are formed.

The sealing ring 12 is a conductive frame-like member one size smaller than the outer shape of each of the base substrates 10, 11, and is bonded to the upper surface of the second base substrate 11. Specifically, the sealing ring 12 is bonded on the second base substrate 11 by baking with a brazing material such as silver solder, a soldering material, or the like, or bonded by fusion bonding to a metal bonding layer formed on the second base substrate 11. The sealing ring 12 constitutes the sidewall of the cavity C together with the inner side surface of the second base substrate 11 (the penetrating part 11a). It should be noted that in the example shown in the drawings, the inner side surface of the sealing ring 12 is disposed so as to be coplanar with the inner side surface of the second base substrate 11.

As the material of the sealing ring 12, there can be cited, for example, a nickel base alloy, and specifically, it is sufficient to be selected from kovar, elinvar, invar, 42-alloy, and so on. In particular, as the material of the sealing ring 12, it is preferable to select a material closer in thermal expansion coefficient to the base substrates 10, 11 made of ceramics. For example, in the case of using alumina having the thermal expansion coefficient of $6.8 \times 10^{-6}/°$ C. as the base substrates 10, 11, kovar having the thermal expansion coefficient of $5.2 \times 10^{-6}/°$ C. or 42-alloy having the thermal expansion coefficient of 4.5 through $6.5 \times 10^{-6}/°$ C. is preferably used as the sealing ring 12.

The sealing plate 6 is formed of an electrically-conductive substrate, and is bonded on the sealing ring 12 to hermetically seal the package main body 5. Further, a space defined by the sealing ring 12, the sealing plate 6, and the base substrates 10, 11 constitutes the cavity C hermetically sealed.

<Piezoelectric Vibrator Element>

Figure 5:
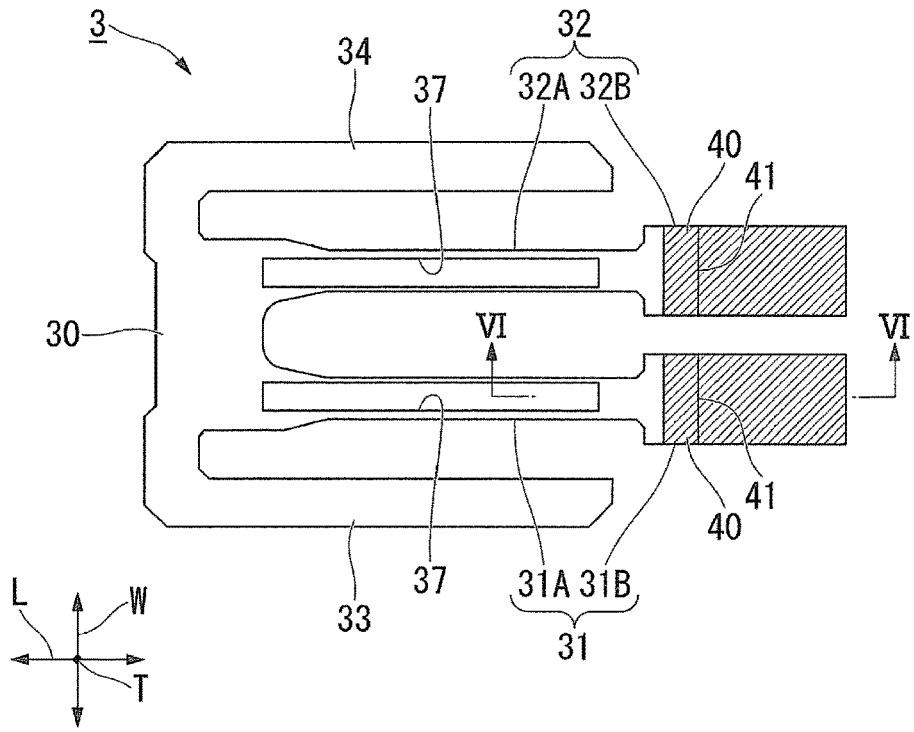
FIG. 5 is a plan view of a piezoelectric vibrator element.

FIG. 5 is a plan view of the piezoelectric vibrator element 3.

As shown in FIG. 5, the piezoelectric vibrator element 3 is a vibrator element formed of a piezoelectric material such as quartz crystal, lithium tantalate, or lithium niobate, and vibrates when a predetermined voltage is applied. It should be noted that the longitudinal direction L, the width direction W, and the thickness direction T of the piezoelectric vibrator 1 coincide with the longitudinal direction, the width direction, and the thickness direction of the piezoelectric vibrator element 3, respectively.

The piezoelectric vibrator element 3 is provided with a base 30, a pair of vibrating arm parts (a first vibrating arm part 31 and a second vibrating arm part 32) extending from the base 30 in the longitudinal direction L, and a pair of support arm parts (a first support arm part 33 and a second support arm part 34) located on both sides in the width direction W with respect to the base 30.

The vibrating arm parts 31, 32 extend from the base 30 to form cantilever configurations, and are arranged side by side in the width direction W. The vibrating arm parts 31, 32 vibrate in directions (along the width direction W) of getting closer to and away from each other using the base end part as the fixed end, and the tip part as the free end. The vibrating arm parts 31, 32 have main body parts 31A, 32A located in the base end part, and weight parts 31B, 32B located in the tip part, respectively.

On the both surfaces in the thickness direction T in each of the main body parts 31A, 32A, there are formed groove parts 37 each recessed in the thickness direction T, and extending in the longitudinal direction L. It should be noted that on the outer surfaces of the main body parts 31A, 32A, there are formed two groups of excitation electrodes (not shown) for vibrating the vibrating arm parts 31, 32 in the width direction W. The excitation electrodes are each formed of, for example, a laminated film made of Cr—Au, and patterned in a state of being electrically isolated from each other.

Figure 6:
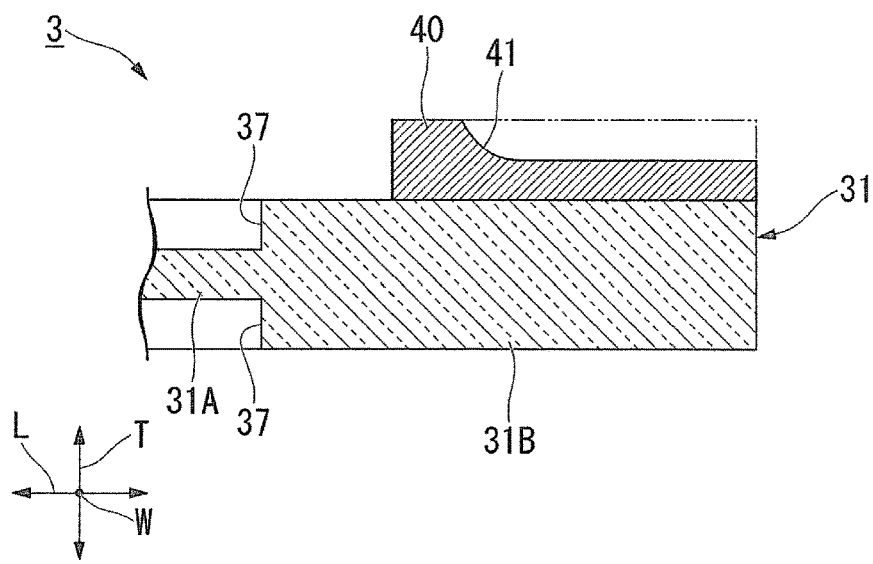
FIG. 6 is a cross-sectional view along the line VI-VI shown in FIG. 5.

FIG. 6 is a cross-sectional view along the line VI-VI shown in FIG. 5.

As shown in FIG. 5 and FIG. 6, the weight parts 31B, 32B are disposed extending from the tip parts of the main body parts 31A, 32A, respectively, in the longitudinal direction L. The weight parts 31B, 32B are arranged to be wider in width in the width direction W than the main body parts 31A, 32A, respectively. Thus, it is possible to increase the mass of the tip parts of the vibrating arm parts 31, 32, and the inertial moment when vibrating, and it is possible to decrease the length of the vibrating arm parts 31, 32 compared to a piezoelectric vibrator element not provided with the weight parts 31B, 32B.

On the obverse surface (a principal surface on one side in the thickness direction T) of each of the weight parts 31B, 32B, there is formed a weight metal film 40. The weight metal film 40 increases the mass in the tip part of each of the vibrating arm parts 31, 32, and suppresses rise in frequency due to the reduction of the length of each of the vibrating arm parts 31, 32. It should be noted that the weight metal films 40 are each made of, for example, Au or Ag, and each have a thickness of about 1 through 10 μm.

Here, in the tip part of each of the weight metal films 40, there is formed a recessed part 41 recessed in the thickness direction T. The recessed part 41 is formed by partially eliminating (trimming) the weight metal film 40 using ion milling in a frequency adjustment process described later. The recessed part 41 in the present embodiment opens toward the both sides in the width direction W and the tip side in the longitudinal direction L, but does not penetrate the weight metal film 40 in the thickness direction T. It should be noted that in the example shown in FIG. 6, in the cross-sectional view along the longitudinal direction L, the recessed part 41 is arranged to have the tip part shaped like a straight line extending along the longitudinal direction L, and have the base end part shaped like a curved line with the depth decreasing toward the base end side of the vibrating arm parts 31, 32.

As shown in FIG. 5, the base 30 integrally connects the base end parts of the respective vibrating arm parts 31, 32 to each other. The both end surfaces in the width direction W in the base 30 are located on the outer side of the vibrating arm parts 31, 32 (the main body parts 31A, 32A).

The support arm parts 33, 34 each exhibit an L shape in a planar view, and surround the base 30 and the vibrating arm parts 31, 32 (the main body parts 31A, 32A) from the outer sides in the width direction W. Specifically, the support arm parts 33, 34 protrude from the both end surfaces in the width direction W in the base 30 outward in the width direction W, and then extend along the longitudinal direction L in parallel to the vibrating arm parts 31, 32, respectively. On the reverse surface (a principal surface on the other side in the thickness direction T) of each of the support arm parts 33, 34, there is disposed a mounting electrode not shown as a mounting part used when mounting the piezoelectric vibrator element 3 on the package 2. The mounting electrodes are formed on the tip parts of the support arm parts 33, 34, respectively.

Each of the mounting electrodes is connected to corresponding one of the excitation electrodes described above via a wiring electrode not shown. The wiring electrodes are formed on the paths from the respective support arm parts 33, 34 to the vibrating arm parts 31, 32 via the base 30.

As shown in FIG. 2 through FIG. 4, the piezoelectric vibrator element 3 described above is housed in the cavity C of the package 2 hermetically sealed. Specifically, in the cavity C, the mounting electrodes of the support arm parts 33, 34 of the piezoelectric vibrator element 3 are mounted on the electrode pads 20A, 20B formed in the mounting parts 14A, 14B of the package 2, respectively, via an electrically-conductive adhesive. Thus, in the cavity C, the piezoelectric vibrator element 3 is supported in a state of floating from the base substrates 10, 11, and at the same time, the mounting electrodes and the electrode pads 20A, 20B are respectively connected to each other via the electrically-conductive adhesive. It should be noted that it is also possible to use metal bumps as the electrically-conductive bonding members instead of the electrically-conductive adhesive. What the electrically-conductive adhesive and the metal bump have in common is that these are the electrically-conductive bonding members having a property of having fluidity in the initial stage of the bonding process, and becoming solidified to develop bonding strength in the later stage of the bonding process.

In order to operate the piezoelectric vibrator 1 configured in such a manner, a predetermined voltage is applied to the external electrodes 21A, 21B (see FIG. 3). Then, a current flows through the excitation electrodes, and an electrical field is generated between the excitation electrodes. The vibrating arm parts 31, 32 vibrate at a predetermined resonant frequency in directions (along the width direction W) of, for example, getting closer to and away from each other due to the inverse piezoelectric effect by the electrical field generated between the excitation electrodes. Further, the vibration of the vibrating arm parts 31, 32 is used as the time source, the timing source of a control signal, the reference signal source, and so on.

<Method of Manufacturing Piezoelectric Vibrator>

Then, a method of manufacturing the piezoelectric vibrator 1 according to the present embodiment will be described.

Firstly, the piezoelectric vibrator element 3 is manufactured. Specifically, an outline pattern not shown of the piezoelectric vibrator element 3 is formed on both surfaces of a wafer 50 (see FIG. 7) using a photolithography process. On this occasion, a plurality of outline patterns is formed on the wafer 50 (an outline formation process). Then, an etching process is performed on each of the surfaces of the wafer 50 using the outline patterns as a mask. Thus, the area, which is not masked by the outline patterns, is selectively removed to thereby form the outline shape of the piezoelectric vibrator element 3. It should be noted that in this state, each of the piezoelectric vibrator elements 3 is in the state of being connected to the wafer 50 via a connection part 51 (see FIG. 7).

Then, the etching process is performed on the vibrating arm parts 31, 32 to form groove parts 37 on the both principal surfaces of each of the vibrating arm parts 31, 32 (a groove part formation process).

Subsequently, an electrode film is patterned on the outer surface of the plurality of piezoelectric vibrator elements 3 to form the excitation electrodes, extraction electrodes, and the mounting electrodes, respectively (an electrode formation process). Specifically, the electrode film is deposited on the outer surface of the plurality of piezoelectric vibrator elements 3 using vapor deposition, sputtering, or the like, and then the etching process is performed on the electrode film to thereby form the electrodes.

Then, the weight metal films 40 used for the frequency adjustment are formed on the surfaces of the weight parts 31B, 32B in the vibrating arm parts 31, 32 (a weight metal film formation process).

Figure 7:
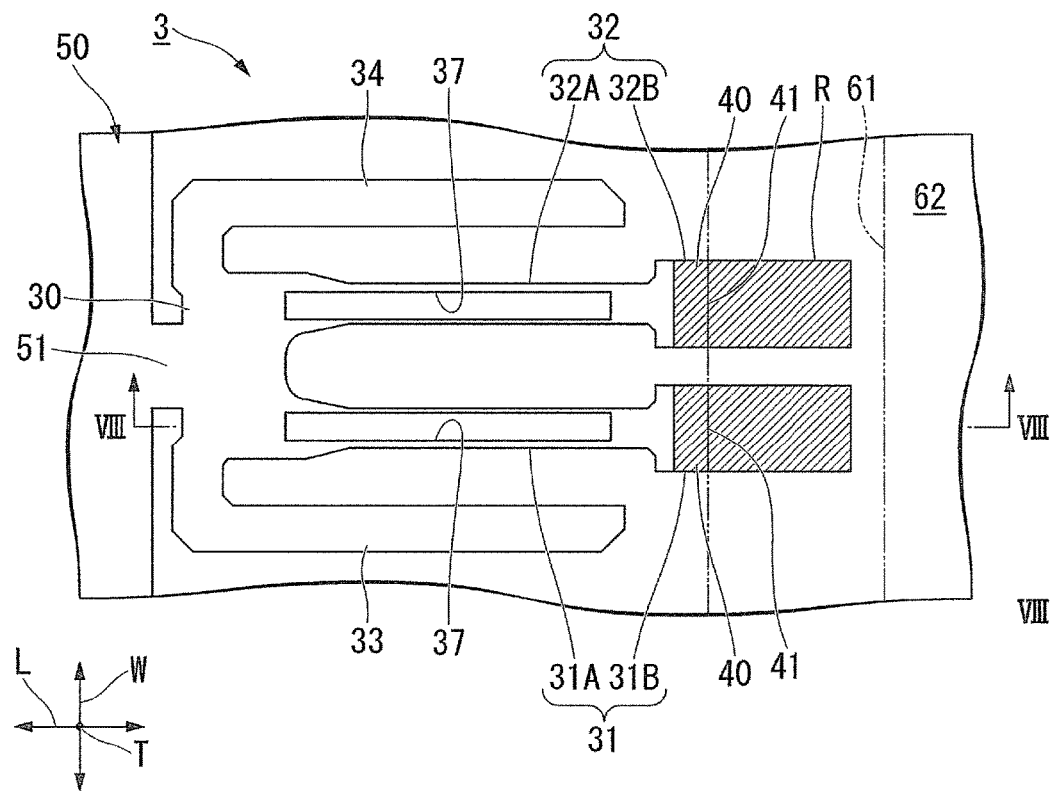
FIG. 7 is a process chart for explaining a first frequency adjustment process, and is a partial plan view of a wafer provided with the piezoelectric vibrator element.
Figure 8:
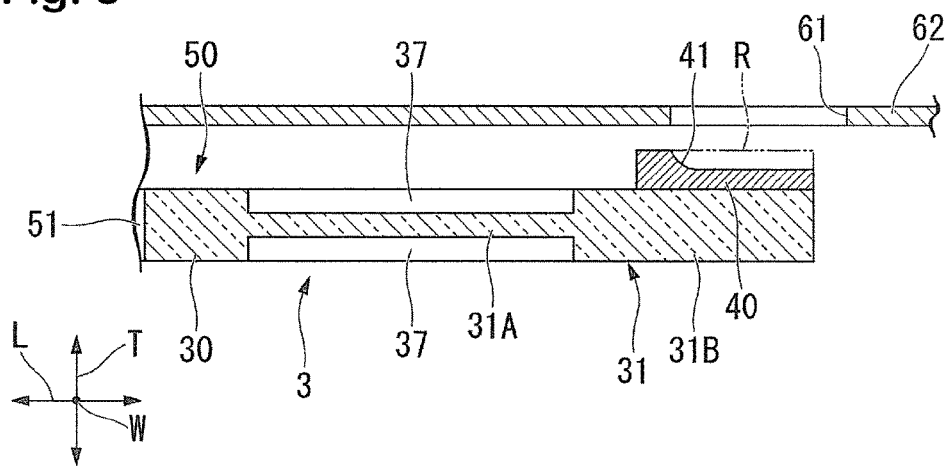
FIG. 8 is a cross-sectional view along the line VIII-VIII shown in FIG. 7.

FIG. 7 and FIG. 8 are process charts for explaining the first frequency adjustment process, wherein FIG. 7 is a partial plan view of the wafer 50 in which the piezoelectric vibrator elements 3 are formed, and FIG. 8 is a cross-sectional view corresponding to the line VIII-VIII shown in FIG. 7.

Then, as shown in FIG. 7 and FIG. 8, the first frequency adjustment process for coarsely adjusting the resonant frequency is performed on each of the piezoelectric vibrator elements 3 formed in the wafer 50. In the first frequency adjustment process of the present embodiment, the weight metal films 40 are partially eliminated (trimmed) by ion milling. Specifically, firstly the wafer 50 is set to a jig in the chamber not shown. Subsequently, a mask 62 having an opening part 61 formed in an area (hereinafter referred to as a trimming area R) to be trimmed in each of the weight metal films 40 is set on the wafer 50 (a mask setting process). The mask 62 covers the entire area of the wafer 50, and has the opening part 61 for collectively exposing the parts corresponding to the trimming areas R of both of the weight metal films 40 of each of the piezoelectric vibrator elements 3 arranged in the width direction W on the wafer 50. In the present embodiment, out of the weight metal film 40, the base end part is covered with the mask 62, and the tip part is exposed through the opening part 61 as the trimming area R.

Subsequently, ion milling is performed to the wafer set in the chamber (a trimming process). Specifically, the chamber is depressurized, and at the same time, a process gas such as argon is introduced into the chamber. If an acceleration voltage is applied in this state, the ionized process gas collides with the weight metal film 40 in the trimming area R through the opening part 61 of the mask 62. Thus, the weight metal film 40 in the trimming area R is flicked off from the surface layer, and thus, the recessed part 41 described above is formed in the weight metal film 40. Then, in accordance with the change in mass of the vibrating arm parts 31, 32 due to the trimming of the weight metal films 40, the resonant frequency of the vibrating arm parts 31, 32 varies. It should be noted that the frequencies of all of the vibrating arm parts 31, 32 formed in the wafer 50 are measured in a lump, and an amount of the trimming in the first frequency adjustment process is determined in accordance with a difference between the frequency thus measured and a target frequency set in advance. In this case, the amount of the trimming is set to a depth with which the weight metal film 40 is not penetrated in the thickness direction T. Further, the particles of the weight metal film 40 flicked off from the trimming area R are separated from the wafer mainly through the opening part 61 of the mask 62.

After the first frequency adjustment process, a segmenting process for cutting the connection parts 51 of the wafer 50 to separate the piezoelectric vibrator elements 3 from the wafer 50 is performed. Thus, the plurality of piezoelectric vibrator elements 3 can be manufactured at a time from the single wafer 50.

Then, the electrically-conductive adhesive is applied on the electrode pads 20A, 20B of the package main body 5, and then the support arm parts 33, 34 of the piezoelectric vibrator element 3 corresponding to the electrode pads 20A, 20B are mounted on the respective electrically-conductive adhesive. Subsequently, the package main body 5 on which the piezoelectric vibrator element 3 is mounted is baked to dry the electrically-conductive adhesive. Thus, the piezoelectric vibrator element 3 is mounted on the package main body 5.

Subsequently, a second frequency adjustment process for finely adjusting the resonant frequency is performed on the piezoelectric vibrator element 3 mounted on the package main body 5. In the second frequency adjustment process of the present embodiment, the weight metal films 40 in the trimming areas R are trimmed using ion milling similarly to the first frequency adjustment process described above. Specifically, the ionized process gas is made to collide with the weight metal film 40 in the trimming area R through the opening part 61 of the mask 62 to flick off the weight metal film 40 in the trimming area R from the surface layer. On this occasion, in the second frequency adjustment process, by lowering the acceleration voltage, for example, compared to the first frequency adjustment process, the etch rate is set to a lower level (e.g., about a half or lower) compared to the first frequency adjustment process. Thus, it is possible to fine adjust the resonant frequency of the piezoelectric vibrator element 3 so as to fit into a predetermined range of the nominal frequency. Further, by applying a voltage to the external electrodes 21A, 21B (see FIG. 1) to vibrate the piezoelectric vibrator element 3, an amount of the trimming in the second frequency adjustment process is determined in accordance with a difference between the frequency measured and the target frequency set in advance. In this case, the amount of the trimming is set to a depth with which the weight metal film 40 is not penetrated in the thickness direction T.

After the completion of the second frequency adjustment process, the sealing plate 6 is bonded to the sealing ring 12 of the package main body 5 to seal the package main body 5 to form the package 2. It should be noted that as the bonding method of the sealing plate 6, there can be cited, for example, seam welding by making a roller electrode have contact, laser welding, and ultrasonic welding. Further, in order to make the welding between the sealing plate 6 and the sealing ring 12 more reliable, it is preferable to form a bonding layer of nickel, gold, or the like having an affinity with each other at least on the lower surface of the sealing plate 6 and the upper surface of the sealing ring 12.

Thus, the piezoelectric vibrator element 1 according to the present embodiment is completed.

As described above, in the present embodiment, there is adopted the configuration of performing each of the frequency adjustment processes using ion milling.

According to this configuration, by performing each of the frequency adjustment processes using ion milling, occurrence of the burr after the trimming can be suppressed unlike the case of performing the trimming using the laser as in the related art. Further, by trimming the weight metal film 40 using ion milling, the particles of the weight metal film 40 scattered from the trimming area R can be made smaller in size compared to the case of performing the trimming using the laser. Therefore, even if the particles of the weight metal film 40 adhere again on the piezoelectric vibrator element 3, it is possible to inhibit the particles having adhered again from being separated from the piezoelectric vibrator element 3.

Therefore, it is possible to provide the piezoelectric vibrator element 3, which is superior in vibration characteristics, high in quality, and capable of suppressing a variation in the frequency of the vibrating arm parts 31, 32 after the frequency adjustment.

Moreover, in the present embodiment, by performing each of the frequency adjustment processes using ion milling, the weight metal film 40 can be trimmed irrespective of the thickness of the weight metal film 40, and therefore, it is possible to deal with thickening of the weight metal film 40 due to miniaturization of the piezoelectric vibrator element 3.

Further, in the present embodiment, since the etch rate in the second frequency adjustment process is set to be lower than in the first frequency adjustment process, the frequency of the vibrating arm parts 31, 32 can finely be adjusted so as to come closer to the target frequency. Thus, a further improvement in quality can be achieved.

Further, in the present embodiment, by performing the first frequency adjustment process before the mounting on the package main body 5, the trimming of the weight metal film 40 can be performed in the state in which the piezoelectric vibrator element 3 (the wafer 50) is held by the jig in the stable posture. Thus, the desired area (the trimming area R) of the weight metal film 40 can surely be trimmed.

Further, in the present embodiment, since the first frequency adjustment process is performed in the state in which the plurality of piezoelectric vibrator elements 3 is connected to the wafer 50, the trimming can be performed in a lump on the weight metal films 40 of the plurality of piezoelectric vibrator elements 3, and thus, an improvement in manufacturing efficiency can be achieved.

Further, in the present embodiment, by performing the second frequency adjustment process after the mounting on the package main body 5, the frequency of the vibrating arm parts 31, 32 can be adjusted in the state more similar to the real product (the piezoelectric vibrator 1). Thus, a further improvement in quality can be achieved.

Further, in the present embodiment, by covering the base end part of the weight metal film 40 with the mask 62 in each of the frequency adjustment processes, it is possible to inhibit the excitation electrode and so on formed on the base end side of the weight metal film 40 in the vibrating arm parts 31, 32 from being trimmed together with the weight metal film 40. Thus, it is possible to inhibit breaking of the excitation electrodes and so on to increase the yield ratio.

Further, by performing the trimming with the depth with which the weight metal film 40 is not penetrated in each of the frequency adjustment processes, it becomes possible to provide tolerance in the amount of the trimming, and it becomes easy to absorb the variation in frequency in each of the piezoelectric vibrator elements 3 by the adjustment of the amount of the trimming.

Further, in the piezoelectric vibrator 1 according to the present embodiment, since the piezoelectric vibrator element 3 described above is hermetically encapsulated in the package 2, the piezoelectric vibrator 1 superior in vibration characteristics and high in quality can be provided.

It should be noted that the scope of the invention is not limited to the embodiment described above, but various modifications can be applied within the scope or the spirit of the invention.

For example, although in the embodiment described above, there is explained the configuration in which the first frequency adjustment process is performed prior to the mounting on the package 5, and the second frequency adjustment process is performed after the mounting on the package 5, this configuration is not a limitation, and the timing of performing each of the frequency adjustment processes can arbitrarily be changed. Further, although in the embodiment described above, there is explained the configuration in which the first frequency adjustment is performed in the state in which the piezoelectric vibrator element 3 is connected to the wafer 50, it is also possible to perform the first frequency adjustment on the piezoelectric vibrator element 3 after the segmenting and before the mounting.

Although in the embodiment described above, there is explained the configuration in which a single recessed part 41 due to the trimming is formed in each of the vibrating arm parts 31, 32, this configuration is not a limitation, and it is also possible to form a plurality of recessed parts in each of the vibrating arm parts 31, 32.

Although in the embodiment described above, there is explained the configuration in which the same trimming area R is trimmed in each of the frequency adjustment processes, the configuration is not a limitation, and it is also possible to trim different trimming areas in the respective frequency adjustment processes.

Further, although in the embodiment described above, there is explained the configuration in which the two frequency adjustment processes different in etch rate, namely the first frequency adjustment process and the second frequency adjustment process, are performed, the configuration is not a limitation, and it is also possible to perform three or more frequency adjustment processes different in etch rate.

Further, a design change can arbitrarily be applied to the etch rate in each of the frequency adjustment processes.

Further, in the case in which the first frequency adjustment process is performed in the state in which the plurality of piezoelectric vibrator elements 3 is connected to the wafer 50, it is also possible to adjust the amount of the trimming of each of the piezoelectric vibrator elements 3 individually, or every group including a plurality of piezoelectric vibrator elements 3 using, for example, a shutter provided to the chamber.

Although in the embodiment described above, there is explained the configuration of performing the ion milling with the depth with which the weight metal film 40 is not penetrated, the configuration is not a limitation, and the weight metal film 40 can also be penetrated. In this case, it is also possible to adopt a configuration in which, for example, the ion milling is performed up to the depth with which the weight metal film 40 is not penetrated in the first frequency adjustment process, and then the ion milling is performed up to the depth with which the weight metal film 40 is penetrated in the second frequency adjustment process.

Further, a design change can arbitrarily be applied to the thickness, a formation range, and so on of the weight metal film 40.

Further, although in the embodiment described above, there is explained the case in which the invention is applied to the piezoelectric vibrator element 3 having the support arm parts 33, 34 disposed on the outer side in the width direction W with respect to the vibrating arm parts 31, 32, namely a so-called side-arm type piezoelectric vibrator element 3, the case is not a limitation. That is, it is sufficient for the piezoelectric vibrator element 3 to have a pair of vibrating arm parts 31, 32, and it is also possible for the piezoelectric vibrator element 3 to be, for example, a so-called center-arm type piezoelectric vibrator element in which a single support arm part is disposed between a pair of vibrating arm parts, or a so-called tuning-fork type vibrator element not provided with the support arm part.

Further, although in the embodiment described above, the ceramic package type surface-mounted vibrator is described as the piezoelectric vibrator 1 using the piezoelectric vibrator element 3, this is not a limitation. For example, it is also possible to apply the invention to a glass package type piezoelectric vibrator 1 in which the base substrate and the lid substrate made of glass are bonded to each other using anodic bonding.

Besides the above, it is arbitrarily possible to replace the constituents in the embodiment described above with known constituents within the scope or the spirit of the invention, and it is also possible to arbitrarily combine the modified examples described above.

What is claimed is:

1. A method of manufacturing a piezoelectric vibrator element, comprising:
    a first frequency adjustment step of ion milling a weight metal film to remove weight metal from a surface of a tip part in each of a pair of vibrating arm parts; and
    a second frequency adjustment step, after the first frequency adjustment step, of ion milling the weight metal film at a lower etch rate than in the first frequency adjustment step.

2. The method of manufacturing a piezoelectric vibrator element according to claim 1, wherein the first frequency adjustment step is performed prior to mounting on a package.

3. The method of manufacturing a piezoelectric vibrator element according to claim 1, wherein the second frequency adjustment step is performed after the mounting on the package.

4. The method of manufacturing a piezoelectric vibrator element according to claim 1, wherein the first frequency adjustment step and the second frequency adjustment step include a mask setting step of setting a mask having an opening part on the vibrating arm parts, and a trimming step of trimming a part exposed through the opening part out of the weight metal film using ion milling, and in the mask setting step, the mask is set so that a base end part of the weight metal film is covered.

5. The method of manufacturing a piezoelectric vibrator element according to claim 1, wherein in the first frequency adjustment step and the second frequency adjustment step, the ion milling is performed to a depth in which the weight metal film is not penetrated.

6. A piezoelectric vibrator element manufactured using the method of manufacturing a piezoelectric vibrator element according to claim 1, comprising:

a recessed part formed by partially removing the weight metal film using the ion milling.

7. A piezoelectric vibrator comprising:

the piezoelectric vibrator element according to claim 6; and a package adapted to hermetically encapsulate the piezoelectric vibrator element.

\* \* \* \* \*